United States Patent
Ito et al.

(10) Patent No.: US 11,031,211 B2
(45) Date of Patent: Jun. 8, 2021

(54) CHARGED PARTICLE BEAM DEVICE, AND OBSERVATION METHOD AND ELEMENTAL ANALYSIS METHOD USING THE SAME

(71) Applicant: Hitachi High-Technologies Corporation, Tokyo (JP)

(72) Inventors: Naoto Ito, Tokyo (JP); Yu Yamazawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/640,613

(22) PCT Filed: Aug. 24, 2017

(86) PCT No.: PCT/JP2017/030330
§ 371 (c)(1),
(2) Date: Feb. 20, 2020

(87) PCT Pub. No.: WO2019/038883
PCT Pub. Date: Feb. 28, 2019

(65) Prior Publication Data
US 2020/0185190 A1 Jun. 11, 2020

(51) Int. Cl.
*H01J 37/28* (2006.01)
*H01J 37/10* (2006.01)
(Continued)

(52) U.S. Cl.
CPC ............ *H01J 37/28* (2013.01); *H01J 37/10* (2013.01); *H01J 37/1475* (2013.01);
(Continued)

(58) Field of Classification Search
CPC ........ H01J 37/28; H01J 37/10; H01J 37/1475; H01J 37/244; H01J 2237/0473;
(Continued)

(56) References Cited

U.S. PATENT DOCUMENTS

| 6,025,593 A | 2/2000 | Suzuki et al. |
| 2002/0028399 A1* | 3/2002 | Nakasuji ............... H01J 37/266 430/30 |

(Continued)

FOREIGN PATENT DOCUMENTS

| JP | 5-126771 A | 5/1993 |
| JP | 10-302705 A | 11/1998 |

(Continued)

OTHER PUBLICATIONS

International Search Report (PCT/ISA/210) issued in PCT Application No. PCT/JP2017/030330 dated Nov. 21, 2017 with English translation (nine (9) pages).

(Continued)

*Primary Examiner* — Nicole M Ippolito
(74) *Attorney, Agent, or Firm* — Crowell & Moring LLP

(57) ABSTRACT

A charged particle beam device capable of easily discriminating the energy of secondary charged particles is realized. The charged particle beam device includes a charged particle source, a sample stage on which a sample is placed, an objective lens that irradiates the sample with a charged particle beam from the charged particle source, a deflector that deflects secondary charged particles released by irradiating the sample with the charged particle beam, a detector that detects the secondary charged particles deflected by the deflector, a sample voltage control unit that applies a positive voltage to the sample or the sample stage, and a deflection intensity control unit that controls the intensity with which the deflector deflects the secondary charged particles.

13 Claims, 7 Drawing Sheets

(51) Int. Cl.
*H01J 37/14* (2006.01)
*H01J 37/244* (2006.01)
*H01J 37/147* (2006.01)

(52) U.S. Cl.
CPC ..... *H01J 37/244* (2013.01); *H01J 2237/0473* (2013.01); *H01J 2237/0475* (2013.01); *H01J 2237/24485* (2013.01); *H01J 2237/24564* (2013.01); *H01J 2237/2806* (2013.01)

(58) Field of Classification Search
CPC ..... H01J 2237/0475; H01J 2237/24485; H01J 2237/24564; H01J 2237/2806
USPC .......................... 250/306, 307, 309, 310, 311
See application file for complete search history.

(56) References Cited

U.S. PATENT DOCUMENTS

2002/0148960 A1 10/2002 Todokoro et al.
2013/0299697 A1* 11/2013 Enyama .................. H01J 37/12
                     250/307

FOREIGN PATENT DOCUMENTS

| | | |
|---|---|---|
| JP | 2000-133194 A | 5/2000 |
| JP | 2006-302689 A | 11/2006 |
| JP | 2014-78458 A | 5/2014 |
| JP | 2015-15201 A | 1/2015 |

OTHER PUBLICATIONS

Japanese-language Written Opinion (PCT/ISA/237) issued in PCT Application No. PCT/JP2017/030330 dated Nov. 21, 2017 (six (6) pages).

Japanese-language Office Action issued in Japanese Application No. 2019-537502 dated Dec. 8, 2020 with English translation (five (5) pages).

* cited by examiner

[FIG. 1]
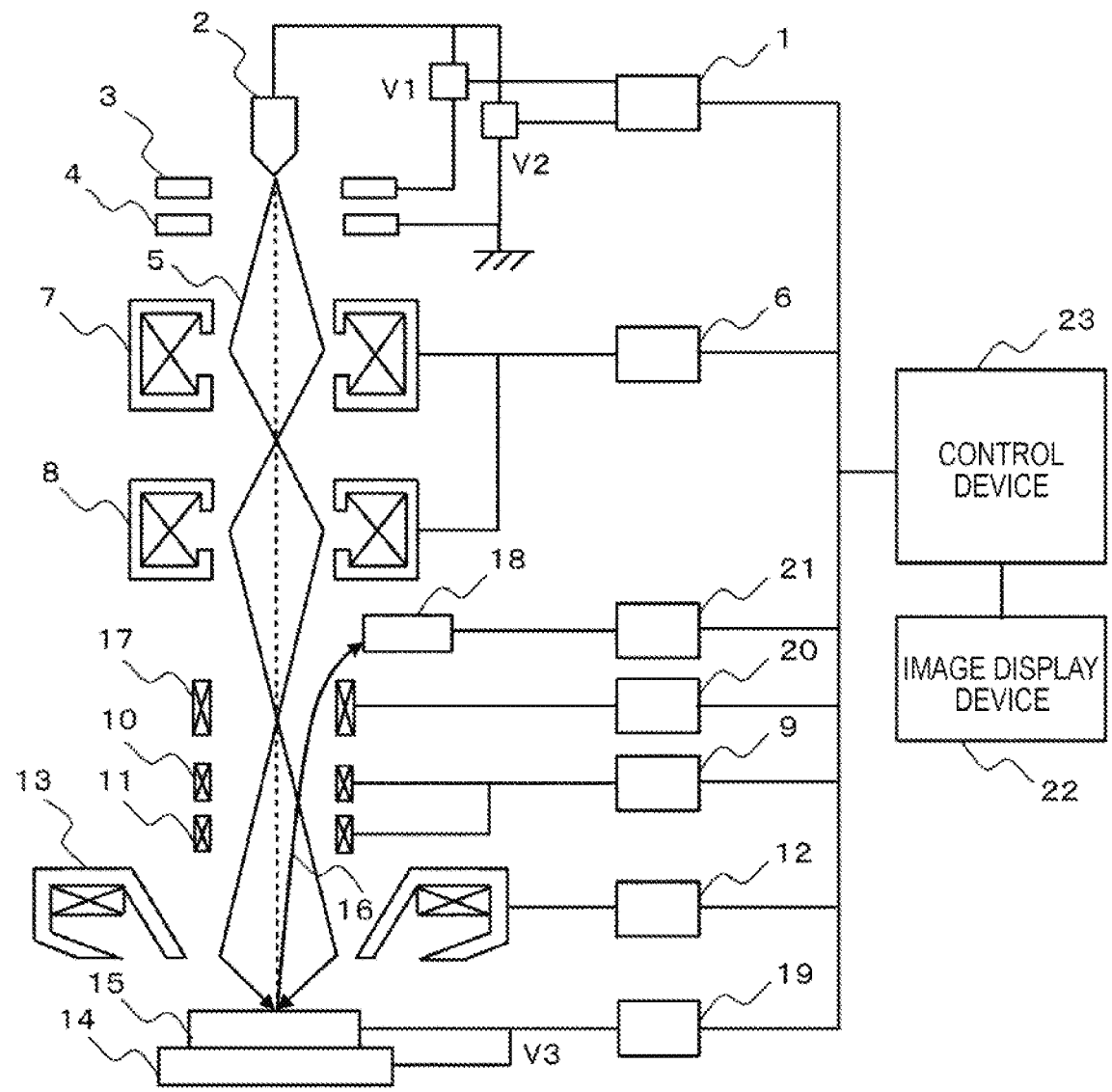

[FIG. 2]
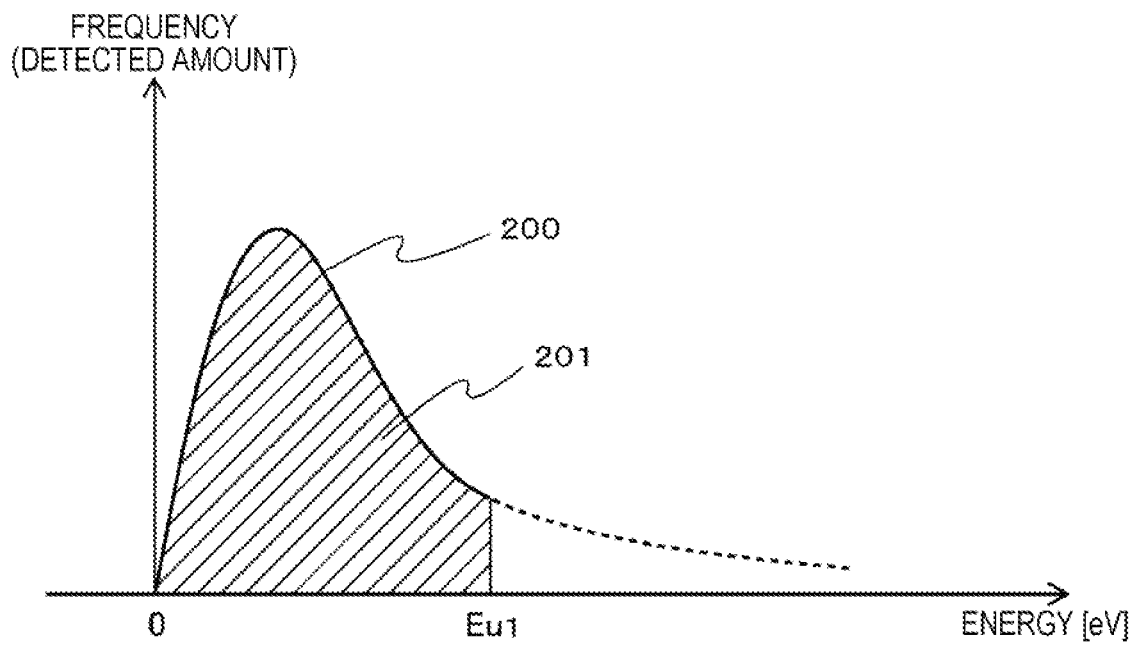
[FIG. 3]
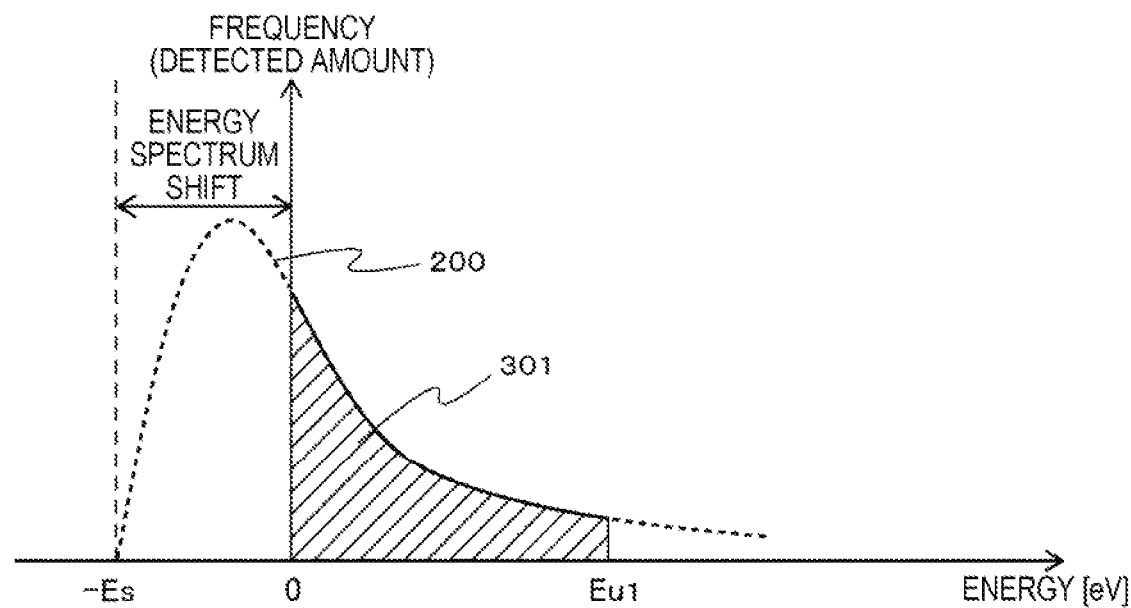

[FIG. 4]
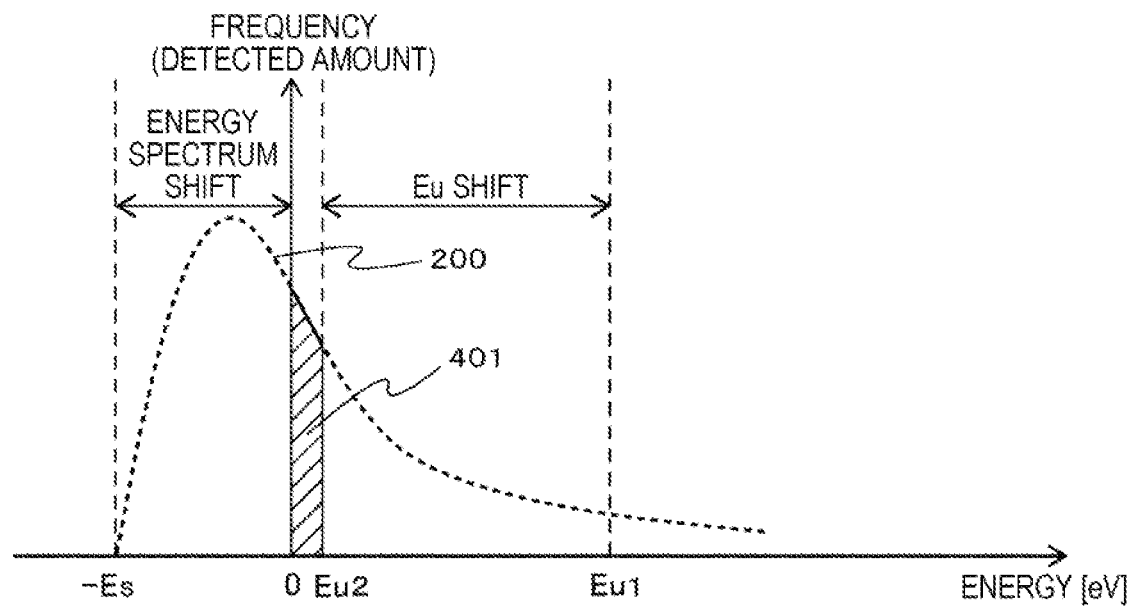
[FIG. 5]
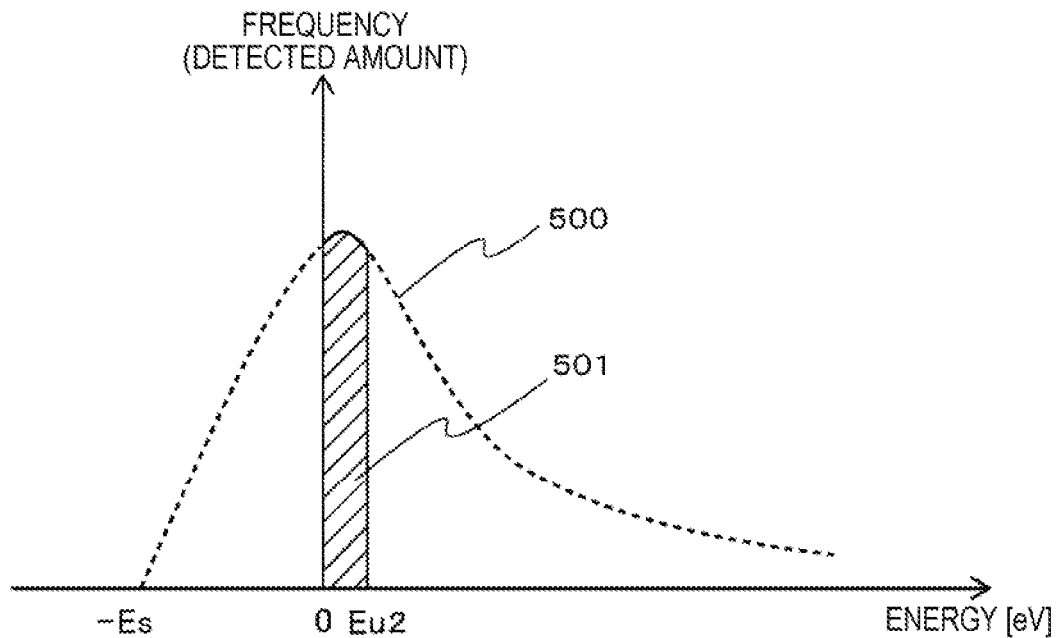

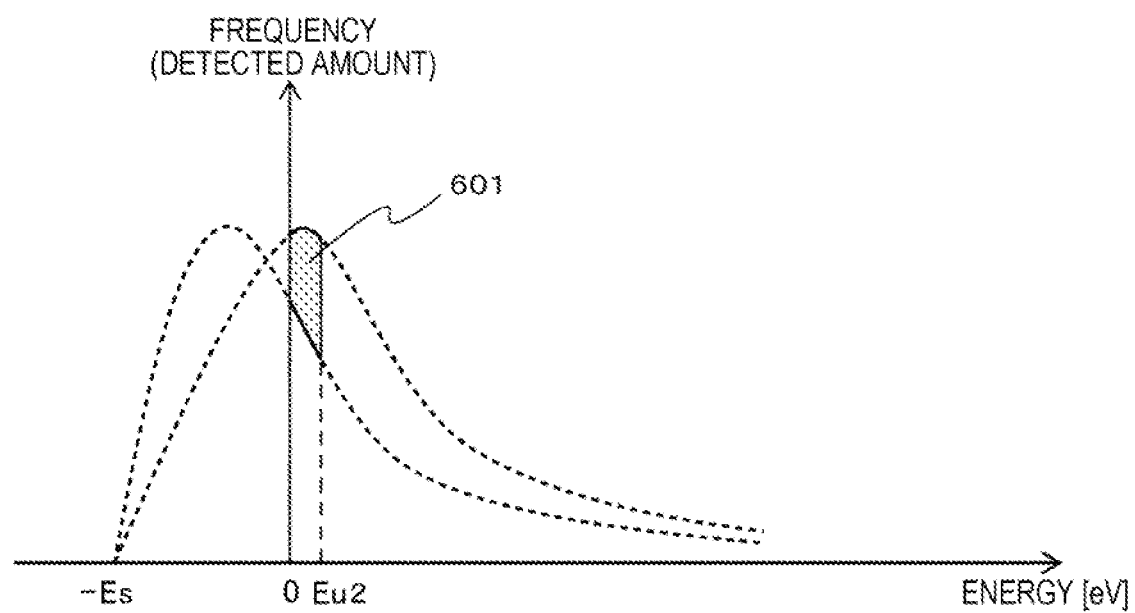
[FIG. 6]

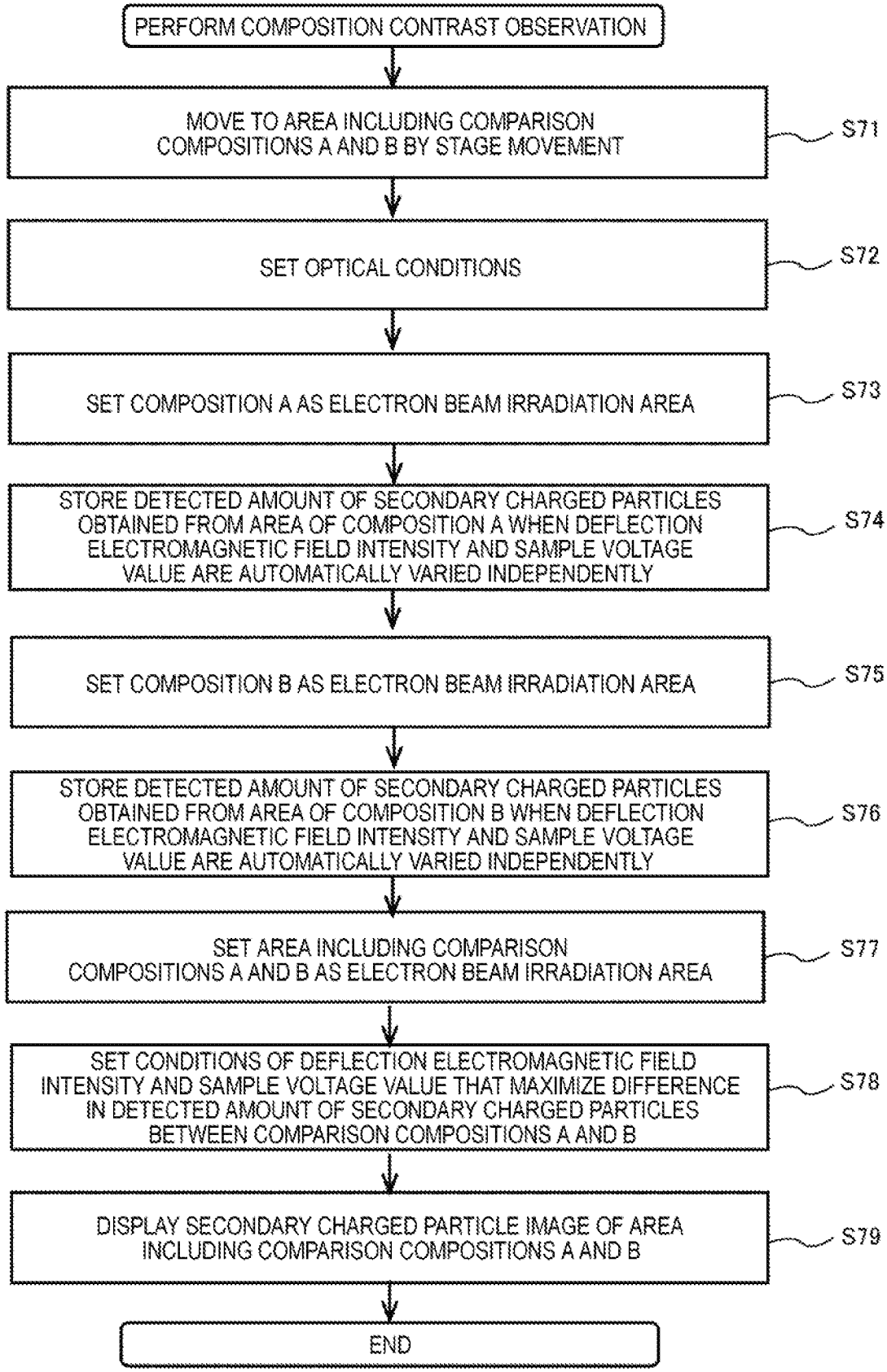

[FIG. 8]
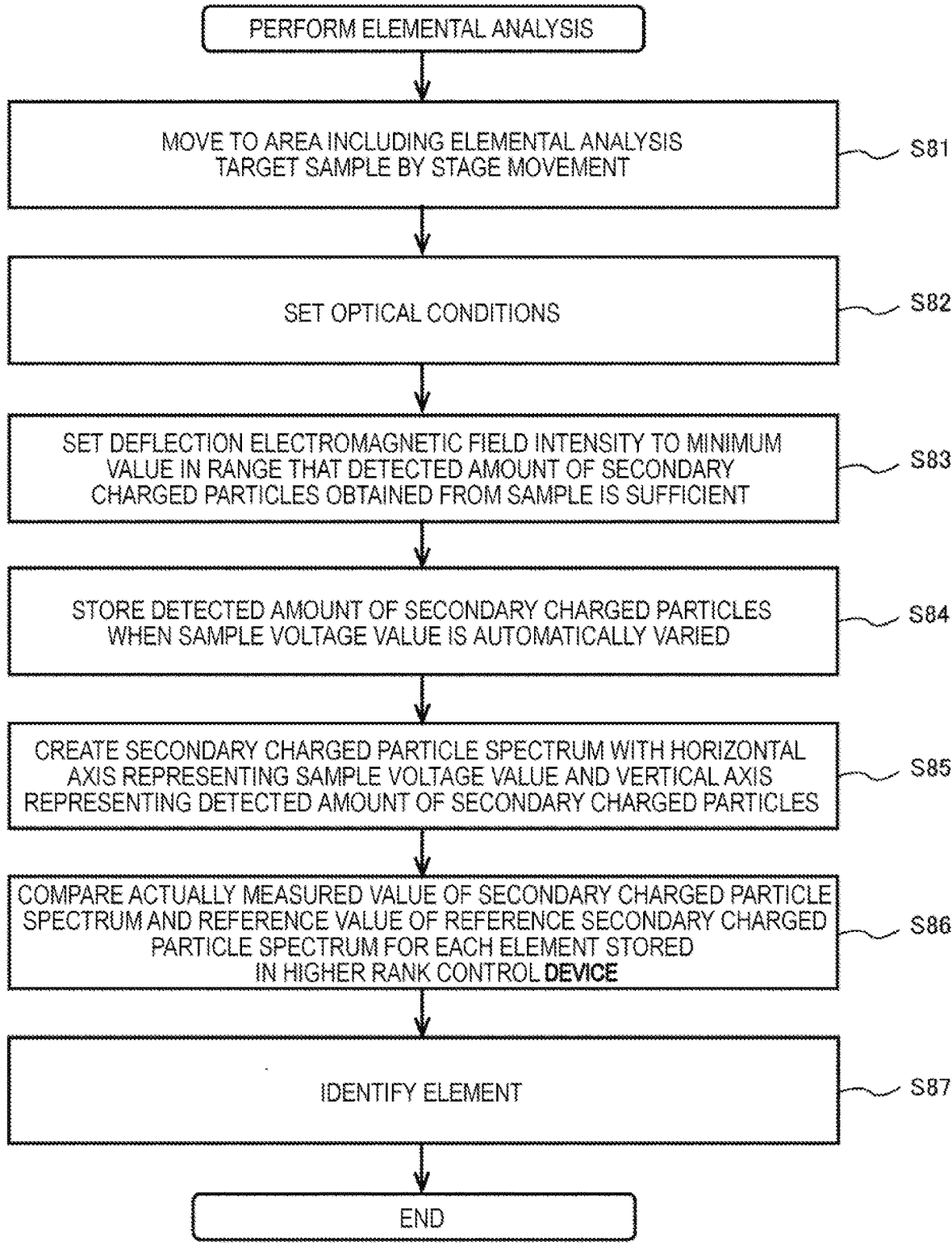

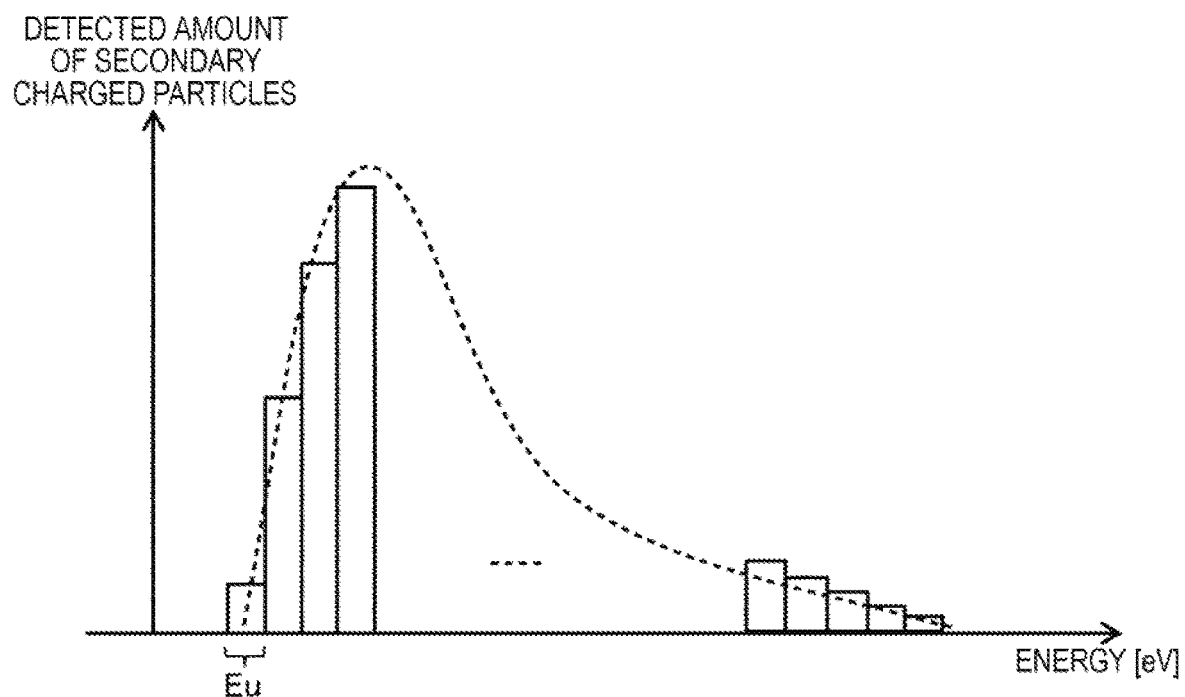

CHARGED PARTICLE BEAM DEVICE, AND OBSERVATION METHOD AND ELEMENTAL ANALYSIS METHOD USING THE SAME

TECHNICAL FIELD

The present invention relates to a charged particle beam device that detects secondary charged particles released from a sample by irradiating the sample with charged particles, and particularly to a charged particle beam device that selectively discriminates and detects secondary charged particles having a desired energy.

BACKGROUND ART

In a charged particle beam device represented by a scanning electron microscope (hereinafter abbreviated as "SEM"), a charged particle beam that is finely focused on a fine sample is scanned, thereby detecting a secondary charged particle released from the sample by a detector installed above the sample. Since the secondary charged particle reflects information such as the form, composition, or potential of the sample, the sample can be observed, measured, or analyzed based on the detected amount of the secondary charged particle.

As a technique for analyzing the extreme surface and fine region of a sample, there is Auger Electron Spectroscopy (hereinafter abbreviated as "AES"). In AES, a SEM equipped with an Auger electron spectrometer is used to irradiate a sample with focused charged particles, and measure the kinetic energy of the Auger electrons released from the extreme surface of the sample through the Auger transition process and its relative value, thereby performing qualitative and quantitative analysis of elements. A feature of AES is that analysis of elements such as Li to U excluding H and He is possible on the extreme surface of several nanometers or less from the sample surface and a fine region of about several tens of nanometers.

For this reason, the AES device can be a device for an effective analysis method on the extreme surface and in a fine region as compared with other electron spectroscopy devices such as an X-ray photoelectron spectrometer and a photoelectron diffraction device. However, there is a problem that AES is inherently difficult to detect high-energy Auger electrons. In order to solve this problem, JP-A-2006-302689 (PTL 1) discloses a technique for improving the detection efficiency by uniformly shifting an energy spectrum of high-energy Auger electrons toward the low energy side. In PTL 1, a positive voltage is applied to a sample irradiated with charged particles, a secondary charged particle beam is decelerated in the vicinity of the sample, and the energy spectrum is uniformly shifted to the low energy side.

CITATION LIST

Patent Literature

PTL 1: JP-A-2006-302689

SUMMARY OF INVENTION

Technical Problem

Since AES uses a huge hemispherical electron spectrometer mounted on a charged particle beam device, AES has a high energy resolution of about 0.1%. However, Auger electron spectrometers are large, complex, and expensive.

The energy spectrum of the secondary charged particles released when the sample is irradiated with charged particles depends on the sample composition or the sample potential. However, in particular, since secondary electrons, which are generally defined as electrons having an energy of 50 eV or less, are concentrated and observed in a relatively narrow low-energy band, information on the sample composition could not be actually obtained from the detection signal of secondary electrons in the observation method in the related art. On the other hand, if secondary charged particles in the desired energy band can be discriminated and detected, a composition contrast image and a potential contrast image of the sample can be obtained from the difference in the detected amount of secondary charged particles due to the difference in the sample composition.

Solution to Problem

A charged particle beam device according to an embodiment of the present invention includes a charged particle source, a sample stage on which a sample is placed, an objective lens that irradiates the sample with a charged particle beam from the charged particle source, a deflector that deflects secondary charged particles released by irradiating the sample with the charged particle beam, a detector that detects the secondary charged particles deflected by the deflector, a sample voltage control unit that applies a positive voltage to the sample or the sample stage, and a deflection intensity control unit that controls the intensity with which the deflector deflects the secondary charged particles.

Other problems and novel features will become apparent from the description of the specification and the accompanying drawings.

Advantageous Effects of Invention

A charged particle beam device capable of easily discriminating the energy of secondary charged particles is realized.

BRIEF DESCRIPTION OF DRAWINGS

FIG. 1 is a schematic diagram of a SEM.

FIG. 2 is a diagram illustrating an energy distribution of secondary charged particles released from a sample grounded to the ground.

FIG. 3 is a diagram illustrating an energy distribution of secondary charged particles released from a sample to which a sample voltage value Es [eV] is applied.

FIG. 4 is a diagram illustrating an energy detection range of secondary charged particles of a sample (composition A) at the sample voltage value Es [eV] and a deflection electromagnetic field intensity Eu2 [eV].

FIG. 5 is a diagram illustrating an energy detection range of secondary charged particles of a sample (composition B) at the sample voltage value Es [eV] and the deflection electromagnetic field intensity Eu2 [eV].

FIG. 6 is a diagram obtained by superimposing FIG. 4 and FIG. 5.

FIG. 7 is a flowchart of composition contrast observation.

FIG. 8 is a flowchart of elemental analysis.

FIG. 9 is an example of an energy spectrum approximately obtained by elemental analysis.

DESCRIPTION OF EMBODIMENTS

In a charged particle beam device, generally, a deflector and a detector are arranged above an objective lens that serves to focus charged particles on a sample, and secondary charged particles are guided to the detector by the deflecting electromagnetic field of the deflector. In the present embodiment, energy discrimination of secondary charged particles is realized by introducing control of the positive voltage value applied to the sample or the sample stage and control of the deflection intensity of the deflector.

The lower the secondary charged particle energy, the more susceptible to the deflection action. Therefore, the secondary charged particle having an energy smaller than a specific value is guided to the detector by the deflection electromagnetic field, and the value depends on the intensity of the deflection electromagnetic field of the deflector. By controlling the deflection intensity of the deflector, it becomes possible to control the upper limit value of the energy of the secondary charged particle deflected to the detector.

Further, when a positive voltage is applied to the sample or the sample stage, the secondary charged particle is decelerated by the positive potential in the vicinity of the sample, and the energy of the secondary charged particle is reduced by a value equivalent to the positive potential. At this time, only the secondary charged particles having an energy larger than the positive potential can travel upward through the potential barrier of the positive potential and reach the detector. Therefore, the lower limit value of the energy of the detected secondary charged particle can be controlled by controlling the positive voltage value to be applied.

Hereinafter, an embodiment will be described in which the present invention is applied to a SEM as an example of a charged particle beam device. FIG. 1 is a schematic diagram of a SEM. Charged particles (electrons) 5 are extracted from a charged particle source 2 by an extraction voltage V1 applied to an extraction electrode 3. Further, an acceleration electrode 4 is grounded to the ground (reference potential), and an acceleration voltage V2 is applied between the acceleration electrode 4 and the charged particle source 2. The extraction voltage V1 and the acceleration voltage V2 are controlled by a charged particle source control unit 1.

The charged particles 5 are accelerated by the acceleration voltage V2, then focused by focusing lenses 7 and 8 which are controlled by a focusing lens control unit 6, and then scanned above a sample by two sets of scanners 10 and 11 which are controlled by a scanning coil control unit 9. Further, the charged particles 5 are focused by an objective lens 13 which is controlled by an objective lens control unit 12 and irradiated onto a sample 15 placed on a sample stage 14.

In an ordinary secondary charged particle detection method, the sample 15 is grounded to the ground, and secondary charged particles (electrons) 16 released from the sample by irradiating the sample 15 with the charged particles 5 are deflected to a detector 18 by a deflector 17 having a constant deflection electromagnetic field intensity. The secondary charged particle 16 deflected by the deflector 17 is detected by the detector 18, and the detection result is sent to an image formation control unit 21 and imaged.

In addition, element control units (the charged particle source control unit 1, the focusing lens control unit 6, the scanning coil control unit 9, the objective lens control unit 12, a sample voltage control unit 19, a deflection intensity control unit 20, and the image formation control unit 21) that control each component of the SEM and an image display device 22 are controlled by a higher rank control device 23.

FIG. 2 illustrates an energy distribution 200 of secondary charged particles released from a sample grounded to the ground. The horizontal axis represents the energy of the secondary charged particle, and the vertical axis represents the frequency (detected amount) of the secondary charged particle. In the drawing, a range 201 indicated by the hatched portion is the energy distribution of the secondary charged particles 16 detected by the detector 18. The lower the energy of the secondary charged particle 16, the more susceptible to deflection. Therefore, according to the deflection electromagnetic field intensity of the deflector 17, the secondary charged particle 16 having an energy smaller than Eu1 [eV] is deflected to the detector 18 by the action of the deflector 17. Therefore, the secondary charged particles having an energy of 0 to Eu1 [eV] when released from the sample 15 are detected by the detector 18.

The device illustrated in FIG. 1 includes the sample voltage control unit 19 that controls a positive voltage value V3 applied to the sample 15 or the sample stage 14, and the deflection intensity control unit 20 that controls the deflection electromagnetic field intensity of the deflector 17. The positive or negative voltage value is determined based on the ground (reference potential). Further, the deflector 17 can be applied with a deflector using either or both of an electric field and a magnetic field, and a decelerating electric field type deflector using only an electric field, or an E×B (E cross B) deflector using an electric field (E) and a magnetic field (B) orthogonal to each other can be applied. Here, a description will be made assuming that an E×B deflector is used as the deflector 17.

When a positive voltage Es [V] is applied to the sample 15, the secondary charged particle 16 having a negative charge released from the sample 15 is decelerated by the action of the positive voltage, and its energy is reduced by Es [eV]. After this energy decreases, the secondary charged particle 16 having an energy of 0 to Eu1 [eV] is deflected to the detector 18 by the action of the deflector 17. FIG. 3 illustrates an energy distribution of secondary charged particles released from the sample to which the positive voltage Es [V] is applied. Compared to FIG. 2, the energy distribution 200 is shifted by −Es [eV]. A range 301 indicated by the hatched portion in FIG. 3 is the energy distribution of the secondary charged particles 16 detected by the detector 18. The secondary charged particles having an energy of Es to Es+Eu1 [eV] when released from the sample 15 are detected by the detector 18. In this way, the lower limit value of the detection energy can be controlled by shifting an energy spectrum by controlling the sample voltage value Es [V] applied to the sample.

Under the condition that the positive voltage Es [V] is applied as the sample voltage, the deflection electromagnetic field intensity of the deflector 17 is weakened, and the upper limit value of the energy of the secondary charged particle on which the deflector 17 exerts a deflection action is set to Eu2 [eV] (Eu1>Eu2). At this time, as illustrated in FIG. 4, a range 401 indicated by the hatched portion is the energy distribution of the secondary charged particles 16 detected by the detector 18. Thus, the upper limit value of the detection energy can be controlled by controlling the deflection electromagnetic field intensity Eu [eV] of the deflector 17.

The energy upper limit value Eu [eV] of the secondary charged particle that receives the action of the deflector 17 is controlled by controlling the deflection electromagnetic field intensity of the deflector 17 while controlling the sample voltage value Es [V] applied to the sample to shift the energy distribution of the secondary charged particles. Thus, the secondary charged particles 16 in the energy range of Es to Es+Eu [eV] can be detected. That is, a desired energy filter can be applied to the secondary charged particle to be detected. By forming an image of the detection signal of the secondary charged particle 16 by the detector 18 with the image formation control unit 21, an energy filter image in a desired energy range can be displayed on the image display device 22.

Thus, by narrowing the energy range detected by the detector, a detector with high energy discrimination can be realized. The energy distribution of secondary charged particles generated when irradiating the sample with charged particles differs depending on the sample composition. By narrowing the energy range to be detected, it becomes possible to detect a difference in the energy distribution and, further, a difference in the sample composition with high sensitivity. For example, it is assumed that the secondary charged particles in the energy distribution 200 in FIGS. 2 to 4 are detected from the area of a composition A of the sample 15. On the other hand, FIG. 5 illustrates an energy distribution when irradiating the area of a composition B of the sample 15 with charged particles. Since the compositions are different, the energy distribution 200 in FIG. 4 and an energy distribution 500 in FIG. 5 have different shapes. By setting the sample voltage value Es [V] and the detection energy upper limit value Eu2 [eV] based on the deflection electromagnetic field intensity, the secondary charged particles 16 in the energy range from Es to Es+Eu2 [eV] can be detected. In the drawing, a range 501 indicated by the hatched portion is the energy distribution of the secondary charged particles 16 detected by the detector 18.

FIG. 6 is a graph in which FIGS. 4 and 5 are superimposed on one graph. For the composition A and the composition B, secondary charged particles are detected in the state where the detection energy upper limit value Eu2 [eV] based on the same deflection electromagnetic field intensity and sample voltage value Es [V] are set. However, since the energy distribution of the secondary charged particles is different by the sample composition, the detected amount of secondary electrons is different between the case of the composition A and the case of the composition B, and a detected amount difference 601 exists. By independently varying the deflection electromagnetic field intensity and the sample voltage value, the upper limit value Eu [eV] and the lower limit value Es [eV] of the detection energy can be controlled independently. Thus, the conditions of the deflection electromagnetic field intensity and the sample voltage value are searched in which the difference in the detected amount of secondary charged particles is maximized. Under the searched conditions, a secondary charged particle image is formed by the image formation control unit 21 and displayed on the image display device 22, whereby a contrast image with a clear contrast between the composition A and the composition B can be obtained.

The secondary charged particles obtained by limiting the energy range are not particularly limited, but it is particularly effective to observe low-energy secondary electrons (generally defined as electrons having an energy of 50 eV or less). In the case of secondary electrons, since differences in composition cannot be substantially observed by observation with a wide energy width, which is a general observation method, compositional information could not be obtained from secondary electrons. By narrowing the energy range to be detected as in the embodiment, a difference in the generation efficiency of secondary electrons due to a difference in the composition can be detected as a difference in the image contrast. In secondary charged particles generated by irradiating the sample 15 with the charged particles 5, secondary electrons are generated in a large amount, which is effective from the viewpoint of the detected amount when the detection energy range is narrowed. Since the secondary electron image is sensitive to the surface shape of the sample surface, the sample composition, potential, and surface shape of the sample surface greatly contribute to the image contrast.

FIG. 7 is a flowchart of composition contrast observation. This flow is executed by a control device 23. First, the observation visual field is moved to an area including the composition A and the composition B for comparison by moving the stage (step S71). Next, optical conditions for observation are set (step S72). Items to be set and adjusted are not different from the general SEM observation. For example, the setting of an acceleration voltage and current amount of an electron beam, adjustment of an axis for matching the axis of the electron microscope with the center axis of the electron beam, aberration correction for correcting the aberration of the electron beam, and the like are included. When the optical condition is set, the deflection electromagnetic field intensity of the deflector 17 and the sample voltage value are automatically varied independently of the respective areas of the composition A and the composition B, and the detected amount of the secondary charged particles that are measured from the area of the composition A and the area of the composition B is stored (steps S73 to S76). In the case of detecting secondary electrons, the detected amount of secondary charged particles is measured while changing the sample voltage value in a range of about 0 to about 10 [V], and the deflection electromagnetic field intensity in a range of about 10 [eV] from a state without electromagnetic field. When the sample voltage or the deflection electromagnetic field intensity is changed, the positional deviation in the plane direction of the focal point of the charged particle beam and the focus deviation in the optical axis direction occur. The deviations of these optical conditions are corrected by the control device 23 using the objective lens 13 and/or the scanners 10 and 11.

If the observation is performed under the condition that the difference in the detected amount between the area of the composition A and the area of the composition B measured in this way is maximized, the contrast due to the composition becomes maximum. Therefore, an area including the composition A and the composition B is set as an electron beam irradiation area (step S77), and the conditions of the deflection electromagnetic field intensity and the sample voltage value that maximize the difference in the detected amount of the secondary charged particles between the area of the composition A and the area of the composition B obtained in steps S73 to S76 are set (step S78). The secondary charged particle image is displayed (step S79).

The composition contrast observation is not limited to the flowchart of FIG. 7. For example, from the secondary charged particle image, any comparison location (point or range) where contrast by composition is desired may be designated, and the deflection electromagnetic field intensity and the sample voltage value may be automatically or manually adjusted so that the contrast at the comparison location is maximized.

Furthermore, it is also possible to approximately obtain the energy spectrum of the secondary charged particles 16 and perform elemental analysis of the sample. FIG. 8 illustrates a flowchart of elemental analysis. This flow is also executed by the control device 23. First, the observation visual field is moved to an area including the element analysis target sample by moving the stage (step S81). Next, optical conditions for observation are set (step S82). When the deflection electromagnetic field intensity of the deflector 17 is weakened and the secondary charged particles 16 are detected, the detected amount of the secondary charged particles decreases, and thus, the deflection electromagnetic field intensity Eu [eV] is set so that the detected amount satisfies a predetermined level and the deflection electromagnetic field intensity is minimized (step S83). In this state, when the sample voltage value Es [V] is set, as described above, the secondary charged particles 16 in the energy range of Es to Es+Eu [eV] can be detected, and thus, while automatically varying the sample voltage value Es [V], the detected amount of secondary charged particles measured at that time is stored (step S84). A secondary charged particle spectrum is created from the value stored in step S84 with the horizontal axis representing the sample voltage value and the vertical axis representing the detected amount of secondary charged particles (step S85). FIG. 9 illustrates an example of the secondary charged particle spectrum created in step S85. The created secondary charged particle spectrum is displayed on the image display device 22.

The element can be identified (step S87) by comparing the actually measured secondary charged particle spectrum with, for example, the reference value of the reference secondary charged particle spectrum for each element stored in advance in the control device 23 (step S86).

REFERENCE SIGNS LIST

1: Charged particle source control unit
2: Charged particle source
3: Extraction electrode
4: Acceleration electrode
5: Charged particle
6: Focusing lens control unit
7, 8: Focusing lens
9: Scanning coil control unit
10, 11: Scanner
12: Objective lens control unit
13: Objective lens
14: Sample stage
15: Sample
16: Secondary charged particle
17: Deflector
18: Detector
19: Sample voltage control unit
20: Deflection intensity control unit
21: Image formation control unit
22: Image display device
23: Control device

The invention claimed is:

1. A charged particle beam device comprising
a charged particle source;
a sample stage on which a sample is placed;
an objective lens that irradiates the sample with a charged particle beam from the charged particle source;
a deflector that deflects secondary charged particles released by irradiating the sample with the charged particle beam;
a detector that detects the secondary charged particles deflected by the deflector;
a sample voltage control unit that applies a positive voltage to the sample or the sample stage; and
a deflection intensity control unit that controls an intensity with which the deflector deflects the secondary charged particles.

2. The charged particle beam device according to claim 1, wherein
the detector detects the secondary charged particles in an energy range determined by the positive voltage applied to the sample or the sample stage by the sample voltage control unit and the intensity of deflecting the secondary charged particles controlled by the deflection intensity control unit.

3. The charged particle beam device according to claim 2, further comprising:
an image formation control unit that forms an image based on the secondary charged particles detected by the detector.

4. The charged particle beam device according to claim 2, wherein
the secondary charged particle is a secondary electron having an energy of 50 eV or less when the sample or the sample stage is at a reference potential.

5. The charged particle beam device according to claim 1, further comprising:
an extraction electrode that extracts charged particles from the charged particle source; and
an acceleration electrode that accelerates the charged particles, wherein
the acceleration electrode is used as a reference potential.

6. The charged particle beam device according to claim 1, further comprising:
a scanner that deflects the charged particle beam; and
a control device, wherein
the control device controls the objective lens and/or the scanner in order to correct a positional deviation in a plane direction of a focal point of the charged particle beam and/or a focus deviation in an optical axis direction, generated according to the positive voltage applied to the sample or the sample stage by the sample voltage control unit and the intensity of deflecting the secondary charged particles controlled by the deflection intensity control unit.

7. An observation method of a sample having a plurality of composition areas, using a charged particle beam device, wherein
in the charged particle beam device, a positive voltage applied to the sample or a sample stage on which the sample is placed, and an intensity of a deflector for deflecting secondary charged particles released by irradiating the sample with a charged particle beam toward a detector are variable, and
the observation method comprises:
measuring a detected amount of the secondary charged particles detected by the detector by changing the positive voltage and the intensity of the deflector with respect to a first area of the sample having a first composition;
measuring a detected amount of the secondary charged particles detected by the detector by changing the positive voltage and the intensity of the deflector with respect to a second area of the sample having a second composition; and
forming a secondary charged particle image of the sample including the first area and the second area by the positive voltage and the intensity of the deflector that are determined based on a difference between the detected amount of the secondary charged particles for the first area and the detected amount of the secondary charged particles for the second area.

8. The observation method according to claim 7, further comprising:
forming a secondary charged particle image of the sample including the first area and the second area by the positive voltage and the intensity of the deflector that maximize the difference between the detected amount of the secondary charged particles for the first area and the detected amount of the secondary charged particles for the second area.

9. The observation method according to claim 7, wherein the secondary charged particle is a secondary electron having an energy of 50 eV or less when the sample or the sample stage is at a reference potential.

10. An elemental analysis method of a sample, using a charged particle beam device, wherein
in the charged particle beam device, a reference secondary charged particle spectrum for each element is held in advance, and a positive voltage applied to the sample or a sample stage on which the sample is placed and an intensity of a deflector for deflecting secondary charged particles released by irradiating the sample with a charged particle beam toward a detector are variable, and the elemental analysis method comprises:
setting the intensity of the deflector to a predetermined value;
changing the positive voltage and measuring a detected amount of the secondary charged particles detected by the detector to create a secondary charged particle spectrum; and
identifying an element by comparing the created secondary charged particle spectrum with the reference secondary charged particle spectrum.

11. The elemental analysis method according to claim 10, further comprising:
displaying the created secondary charged particle spectrum on an image display device.

12. The elemental analysis method according to claim 10, further comprising:
setting the intensity of the deflector so that the detected amount of the secondary charged particles detected by the detector becomes a minimum value satisfying a predetermined level.

13. The elemental analysis method according to claim 10, wherein
the secondary charged particle is a secondary electron having an energy of 50 eV or less when the sample or the sample stage is at a reference potential.

* * * * *